(12) United States Patent
Desito

(10) Patent No.: US 6,613,385 B2
(45) Date of Patent: Sep. 2, 2003

(54) HIGHLY SPIN-POLARIZED CHROMIUM DIOXIDE THIN FILMS PREPARED BY CVD USING CHROMYL CHLORIDE PRECURSOR

(75) Inventor: William J. Desito, Orono, ME (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 96 days.

(21) Appl. No.: 09/839,149

(22) Filed: Apr. 23, 2001

(65) Prior Publication Data

US 2002/0155217 A1 Oct. 24, 2002

(51) Int. Cl.⁷ .............................................. C23C 16/40
(52) U.S. Cl. ........................... 427/255.31; 427/255.36; 427/255.7
(58) Field of Search ........................ 427/255.29, 255.31, 427/255.36, 255.39, 255.391, 255.7

(56) References Cited

U.S. PATENT DOCUMENTS

| | | | |
|---|---|---|---|
| 3,111,380 A | | 11/1963 | Braus et al. |
| 3,808,035 A | * | 4/1974 | Stelter .................... 117/106 R |
| 4,204,893 A | | 5/1980 | Cox |
| 4,668,528 A | * | 5/1987 | Ehrlich et al. ............. 427/53.1 |
| 4,716,130 A | | 12/1987 | Johnston, Jr. et al. |
| 4,782,034 A | | 11/1988 | Dentai et al. |
| 4,830,982 A | | 5/1989 | Dentai et al. |
| 5,980,983 A | * | 11/1999 | Gordon ....................... 427/226 |

FOREIGN PATENT DOCUMENTS

| | | | |
|---|---|---|---|
| GB | 1 408 294 | | 10/1975 |
| JP | 401188493 | * | 7/1989 |
| WO | WO 93/13243 | | 7/1993 |
| WO | 9313243 | * | 7/1993 |

\* cited by examiner

*Primary Examiner*—Bret Chen
(74) *Attorney, Agent, or Firm*—Rebecca L. Forman; John J. Karasek

(57) ABSTRACT

An efficient and controllable CVD method deposits a high quality epitaxial $CrO_2$ thin film over a non-magnetic substrate in a process chamber by chemical vapor deposition using a volatile liquid chromium compound such as $CrO_2Cl_2$ as a precursor. The method includes: selecting a volatile liquid chromium oxide precursor that decomposes in a heated process chamber to provide a chromium oxide layer on a substrate, placing the volatile liquid chromium oxide precursor in a first bubbler, transporting the volatile liquid chromium oxide precursor vapor with a carrier gas into the heated process chamber having the substrate therein, and growing the chromium oxide layer at a controlled growth rate on the substrate in the heated process chamber.

16 Claims, 2 Drawing Sheets

US 6,613,385 B2

HIGHLY SPIN-POLARIZED CHROMIUM DIOXIDE THIN FILMS PREPARED BY CVD USING CHROMYL CHLORIDE PRECURSOR

FIELD OF THE INVENTION

This invention relates in general to a chemical vapor deposition method for depositing thin film chromium compounds. More specifically, the invention deposits a highly spin-polarized thin film of a chromium oxide on a non-magnetic substrate utilizing chromyl chloride as a precursor.

BACKGROUND OF THE INVENTION

Spin polarized transport effects in materials has become an important and rapidly developing area of basic research and technology. This new field, known as magnetoelectronics, is spurring the development of new devices which cannot be realized with existing semiconductor based electronics. A central component of these devices is ferromagnetic materials which are ideally 100% spin polarized, in which the conduction electrons have only one spin state. Recent point contact experiments have indicated that the spin polarization in chromium dioxide ($CrO_2$) approaches 100%, as disclosed in an article by R. J. Soulen et al., Science 282, 85 (1998). Ultra-thin layers of highly spin-polarized $CrO_2$ have potential applications in giant magnetoresistance (GMR) devices. It is therefore important to develop an efficient and controlled method for preparing $CrO_2$ films.

$CrO_2$ is a ferromagnet with a characteristic Curie temperature of ~395° K that crystallizes with the rutile structure (tetragonal, $P4_2/mnm$). Chromium forms many oxides including $CrO_3$, $Cr_2O_5$, $CrO_2$, and $Cr_2O_3$, with $Cr_2O_3$ being the most stable. The fabrication of thin films of single-phase $CrO_2$ is often difficult, requiring epitaxial growth on appropriate substrates. Epitaxial growth is the method by which a layer of material is set down upon a crystalline substrate, and the layer of material has a crystallographic orientation which is identical to that of the substrate. $CrO_2$ has been shown to irreversibly reduce to $Cr_2O_3$ at temperatures between 250 and 460° C. placing clear temperature constraints on the growth method, as disclosed in the following articles: K. P. Kämper et al. Phys. Rev. Lett. 59, 2788 (1987); L. Ranno et al., J. Appl. Phys. 81, 5774 (1997); and K. Köhler et al., J. Solid State Chem. 119, 13 (1995). Despite these temperature constraints, there have been some attempts to prepare $CrO_2$ thin films by chemical vapor deposition (CVD), which is a method used in the manufacture of integrated circuits or optical fibers, whereby a thin solid film of one material is deposited on the surface of another by using a radio frequency or other electrical energy source to dissociate a reactive gas. Examples include chemical vapor transport (CVT) of $CrO_2Cl_2$ in a sealed tube at 3 atmospheres pressure, photodecomposition of $CrO_2Cl_2$, and photodecomposition of $Cr(CO)_6$ as respectively disclosed in the following articles: L. Ben-Dor et al., J. Cryst. Growth 24/25, 175 (1974), C. Arnone et al., Appl. Phys. Lett. 48, 1018 (1986); and F. K. Perkins et al., Thin Solid Films 198, 317 (1991). The films grown by CVT were not tested to verify that the films were single phase $CrO_2$, and thus it does not appear that these films were of acceptable quality. In the photodecomposition experiments, the $CrO_2$ films formed were not of acceptable quality because they either contained undesirable $Cr_2O_3$ or were amorphous in structure rather than crystalline.

More recently, thin film growth efforts have involved CVD using $CrO_3$ as a precursor based on the Ishibashi method which is described in an article by S. Ishibashi et al., Mater. Res. Bull. 14, 51 (1979) or a high-pressure bomb which is described in an article by L. Ranno et al., J. Appl. Phys. 81, 5774 (1997). The $CrO_3$ precursor is a solid that sublimes at ~260° C. and also partially decomposes.

Conventional liquid precursor handling equipment for CVD typically utilizes a liquid precursor bubbler, automated valves, a pressure controller, mass flow controllers, and precursor flow sensors to deliver precise quantities of vaporized precursor into the reactor. Due to the solid phase $CrO_3$ precursor, the above referenced methods cannot utilize conventional liquid precursor handling equipment for CVD. Instead, in the above referenced processes for depositing a film of $CrO_3$, a two-zone reactor furnace, having two different temperature zones, 250° C. and 400° C. respectively was utilized. The $CrO_3$ precursor is sublimed within the first temperature zone, and within the second temperature zone the sublimated precursor is completely decomposed onto the substrate. $CrO_2$ thin films have been prepared on a variety of substrates using this two-zone method. However, with the two-zone method it is difficult to precisely control the growth rate, thickness, quality, and chemical composition of the $CrO_2$ thin film. In addition, the two-zone method makes development of a tri-layer process very difficult. The tri-layer process is of potential significance for manufacturing non-volatile permanent memory devices. Due to the absence of conventional CVD bubblers which are controlled via external valves, with the two-zone method sequential switching of the precursor gases to form three layers cannot be accomplished in a controllable manner.

It would therefore be desirable to provide a CVD method for the preparation of high quality epitaxial $CrO_2$ thin films in a conventional tube furnace with conventional CVD precursor handling equipment which utilizes a precursor that is a liquid at room temperature and has a high vapor pressure.

SUMMARY OF THE INVENTION

The present invention provides an efficient and controllable method for depositing high quality $CrO_2$ thin films in a conventional tube furnace with conventional CVD precursor handling equipment with $CrO_2Cl_2$ as a precursor. The method produces epitaxial $CrO_2$ films which are metallic, smooth, and highly spin-polarized. This method enhances the possibilities of fabricating GMR and/or tunnel junction devices based on $CrO_2$, and thus opens up new opportunities in magnetoelectronics.

In a preferred embodiment, the method includes: selecting a volatile liquid chromium oxide precursor that decomposes in a heated process chamber to provide a chromium oxide layer on a substrate, placing the volatile liquid chromium oxide precursor in a first bubbler, transporting the volatile liquid chromium oxide precursor vapor with a carrier gas into the heated process chamber having the substrate therein, and growing the chromium oxide layer at a controlled growth rate on the substrate in the heated process chamber. Preferably, the volatile liquid chromium oxide precursor is chromyl chloride, the chromium compound is $CrO_2$, and the substrate is $TiO_2$.

In another embodiment, the chromium compound is $Cr_2O_3$ and the substrate is $Al_2O_3$.

Other advantages and features of the invention will become apparent from the following detailed description of the preferred embodiments and the accompanying drawings.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

Figure 1:
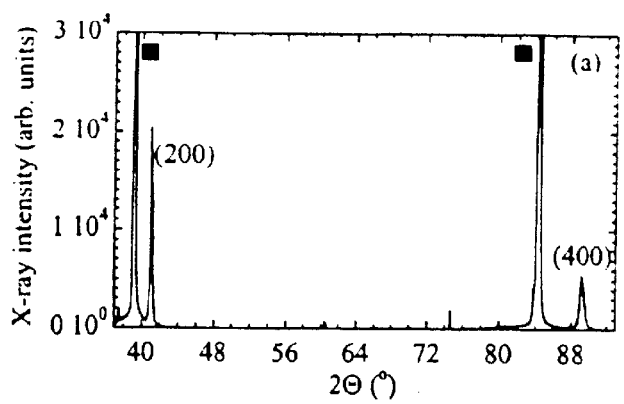
FIG. 1. is an X-ray diffraction pattern of a 2000-Å-thick $CrO_2$ film, $CrO_2$ peaks are labeled (200) and (400) indicating their crystallographic orientation and substrate peaks are labeled ■.
Figure 2:
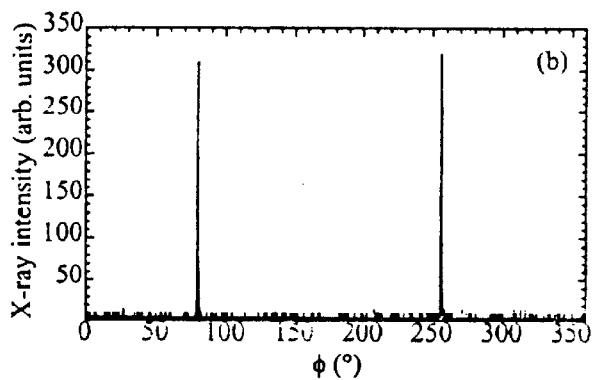
FIG. 2. is a graph of a phi scan which is oriented on the $CrO_2$ (110) orientation line showing expected two-fold symmetry around the (200) orientation direction.

In accordance with the present invention, an alternative CVD method for preparing a high quality epitaxial film of a chromium oxide compound having a crystallographic orientation which matches that of a substrate is provided. Preferably, the method of the present invention utilizes chromyl chloride ($CrO_2Cl_2$) as a precursor. However, other volatile chromium compounds may also be utilized. $CrO_2Cl_2$ is a volatile liquid at room temperature and at 0° C. with a vapor pressure of 24 Torr; therefore, it is compatible with conventional CVD precursor handling equipment. The chromium oxide films were prepared in either a pure argon or oxygen atmosphere. The substrate is preferably $TiO_2$; however, other materials such as $Al_2O_3$ may also be utilized. The method of the present invention may be utilized to form an epitaxial $CrO_2$ film on the $TiO_2$ substrate, and an epitaxial $Cr_2O_3$ film on the $Al_2O_3$ substrate. The chromyl chloride vapor in the heated reactor decomposes into different chromium oxide phases (thin films) depending on the particular substrate material.

To prepare a high quality epitaxial $CrO_2$ (100) film in accordance with a preferred the method of the present invention, conventional CVD precursor handling equipment having a precursor bubbler, a temperature controller, valves, and mass flow controllers is utilized. Initially, a substrates of (100) $TiO_2$ are cleaned in trichloroethane, acetone, methanol, isopropanol, and a 20% HF solution. A $TiO_2$ substrate having a (100) crystallographic orientation is utilized here; however, in accordance with another preferred embodiment of the invention a substrate which is composed of another material or a substrate having any other crystallographic orientation may be utilized. Pure liquid chromyl chloride is placed in a CVD bubbler. The bubbler is attached to a conventional CVD system including mass flow controllers, valves, tubing, and a CVD furnace or reactor. The cleaned $TiO_2$ substrate is placed onto a substrate holder loaded into the reactor. The reactor is flushed with an inert carrier gas, which is preferably either pure dried argon or pure dried oxygen, for 30 minutes at a high gas flow rate of about 500 standard cubic centimeters per minute (sccm). Next, the CVD bubbler is cooled to 0° C., and the temperature of the reactor is raised to 400° C. When the reactor reaches the desired temperature of 400° C., the gas flow rate is lowered to 20–40 sccm, and the appropriate valves are opened and closed to allow the carrier gas to flow through the CVD bubbler containing the chromyl chloride. The carrier gas contains a chromium oxide precursor vapor, which decomposes within the heated reactor to grow a layer of chromium oxide on the substrate. The $CrO_2$ growth rate is about 33 Å min$^{-1}$, and it is independent of the carrier gas ($O_2$ or Ar). Therefore, to deposit a 2000 Å thick $CrO_2$ film, the substrate is heated in the tube furnace for about 60 minutes. After about 60 minutes, the valves are switched to allow the carrier gas and the chromium oxide precursor vapor to bypass the CVD bubbler, the CVD reactor is shut off, and the temperature is lowered. The cooled substrate is then removed from the reactor.

The method of the present invention is well suited for in-situ CVD of multi-layered films, such as a tri-layer non-volatile permanent memory device which is composed of a magnetic film, a non-magnetic film, and a magnetic film. For in-situ CVD of multi-layered films, the substrate wafers remain in the heated tube furnace as the different layers of material are sequentially formed. For each different type of material layer, a separate bubbler, precursor, and carrier gas are prepared. To change the film material as each subsequent film is deposited, the precursor vapor is changed by sequentially opening and closing external precursor gas supply valves. To form a tri-layer non-volatile permanent memory device, a chromium oxide film, a non-magnetic film, and another chromium oxide film are sequentially deposited over a substrate.

Having described the invention, the following examples are given to illustrate specific applications of the invention, including the best mode now known to perform the invention. These specific examples are not intended to limit the scope of the invention described in this application.

EXAMPLE 1

A (100) $TiO_2$ substrate and a (0001) $Al_2O_3$ substrate were cleaned and placed onto a substrate holder. The loaded substrate holder was placed into a CVD reactor, which was composed of a 37 mm diameter quartz tube within a 24 inch furnace. The substrates were positioned within the reactor such that they were within a temperature zone which would reach 400° C. when heated. $CrO_2Cl_2$ within the CVD bubbler was cooled to 0° C. A carrier gas of high purity dried oxygen (5–9's) was allowed to flow through the reactor, bypassing the bubbler to purge the reactor of ambient air for approximately 30 minutes. A mass flow controller was utilized to control the flow rate of carrier gas to 100 sccm. The CVD reactor was heated to 400° C. in approximately one hour. The carrier gas flow was lowered to 20 sccm, and it was diverted to flow through the CVD bubbler. The carrier gas transported the chromyl chloride precursor vapor into the heated reactor. A chromium oxide layer was formed on the substrate. After approximately one hour, the carrier gas flow was changed to bypass the bubbler and the oxygen flow was increased to 100 sccm to stop the reaction and purge the reactor. At this time the reactor was turned off and allowed to cool to room temperature for approximately one to two hours. The substrates were removed from the reactor. The thin film deposited on the $TiO_2$ substrate was observed to be was shiny, black and conducting. The thin film deposited on the $Al_2O_3$ substrate was observed to be green and insulating.

EXAMPLE 2

The procedure of Example 1 was repeated with the exception that a carrier gas of high purity argon (5–9's) was utilized instead of oxygen. The thin films which were deposited on the substrates were observed to have the same properties as Example 1.

EXAMPLE 3

The procedure of Example 2 was repeated with the exception that the reactor and the substrates were heated to a higher temperature of 450° C. The thin film deposited on the $TiO_2$ substrate was composed of a mixture of $CrO_2$ and $Cr_2O_3$. The thin film which was deposited on the $Al_2O_3$ substrate was observed to have the same properties as Example 1.

To verify the quality of epitaxial $CrO_2$ (100) films prepared in accordance with the present invention, the results of structural, magnetic, transport, and spin polarization measurements on the $CrO_2$ films are presented in FIGS. 1–6. The film thickness was measured with x-ray fluorescence and the film microstructure was examined in an atomic force microscope (AFM) sold by Digital Instruments under the trademark DIMENSION AFM. The films were 2000 Å thick, having a shiny and black appearance. The growth rate of the $CrO_2$ film was 33 Å min$^{-1}$, independent of the carrier gas ($O_2$ or Ar), and reproducible. AFM measurements indicated the films had a root-mean-square (rms) roughness between 35 and 60 Å over a 5 $\mu m^2$ scan area. The films grew with a granular microstructure with individual grain sizes from 0.5 to 2 $\mu m$.

FIG. 1. is an X-ray diffraction pattern of a 2000-Å-thick $CrO_2$ film. $CrO_2$ peaks are labeled (200) and (400) indicating their crystallographic orientation and substrate peaks are labeled ■. The crystal structure of the films was studied using an x-ray diffraction system sold by Phillips Analytical under the trademark PHILLIPS MRD, with a four-crystal Ge 220 monochromator on the incident beam, and an x-ray diffraction system sold by Applied Research Laboratories under the trademark SCINTAG XRD, both with Cu K $\alpha_1$ radiation ($\lambda$=1.5405 Å). $\theta/2\theta$ scans were taken both along and at various angles to the growth direction, as well as rocking curves and $\phi$ scans (where $\theta/2\theta$ is set for a particular reflection at an angle $\psi$ to the film normal, and the film is rotated about the film normal) to look for misoriented grains. X-ray diffraction $\theta/2\theta$ scans, as shown in FIG. 1, indicated the films grew completely (200) and (400) oriented, in registry with the (100) oriented $TiO_2$ substrate. In addition, there was no evidence of impurities in the film, including $Cr_2O_3$. The rocking curves for the $CrO_2$ (200) reflection in the films is of order 0.1°. The $\phi$ scan on the $CrO_2$ (110) reflection shows the expected two-fold symmetry, with no evidence of misaligned material, see FIG. 2.

The measured lattice constants for the material are a=4.395 Å, b=4.443 Å, and c=2.916 Å, with an uncertainty of 0.001 Å. This shows that although the films are under compression along the growth direction (~0.5%), the in-plane lattice constant b is expanded by ~0.5%, while c is the same as the bulk value of (100) $CrO_2$.

Figure 3:
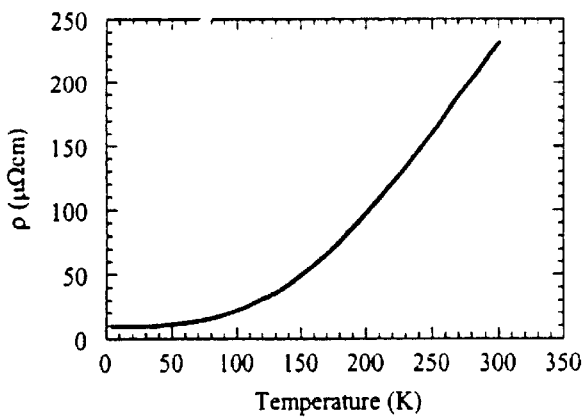
FIG. 3. is a graph of resistivity vs. temperature of a 2000-Å-thick $CrO_2$ film on (100) oriented $TiO_2$.

FIG. 3 shows the electrical resistivity, $\rho$, for a 2000 Å $CrO_2$ film. The resistivity at room temperature was 240/$\mu\Omega$ cm and decreased to 10 $\mu\Omega$ cm at 5° K, which is consistent with metallic behavior. This data compares favorably to the properties described in an article by X. W. Li et al., J. Appl. Phys. 85, 5585 (1999) for measurements taken along the c axis, and it is consistent with the epitaxial quality of the $CrO_2$ films. A high resistivity ratio ($\rho_{298°K}/\rho_{5°K}$=24) further exemplifies the high quality of these epitaxial $CrO_2$ thin films.

Figure 4:
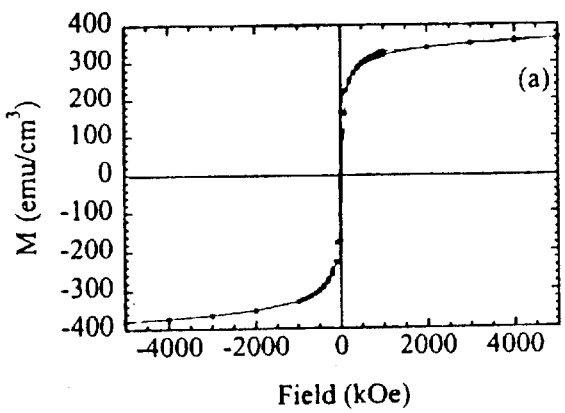
FIG. 4 is a hysteresis curve of a $CrO_2$ film measured at 298° K.
Figure 5:
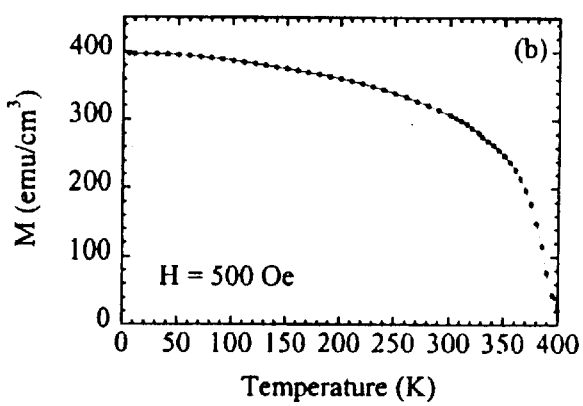
FIG. 5. is a graph of temperature dependent magnetization obtained in a 500 Oe field.

The magnetic properties of the $CrO_2$ films, as measured in a superconducting quantum interference device (SQUID) magnetometer, are shown in FIG. 4. The hysteresis measurements were made with the magnetic field oriented in the plane of the film along a substrate edge. No distinction was made between particular substrate edges. A large magnetic field (H>4 kOe) was needed to saturate the magnetization while only a relatively small coercivity ($H_C$<100 Oe) was observed. The saturation magnetization was determined to be 670 and 365 emu/cm$^3$ at 5 and 298° K, respectively. These magnetization values are slightly lower than previously published values. However, this discrepancy is probably due to the error in the determination of the total volume of $CrO_2$ material, since a nonuniform amount of $CrO_2$ grew on the back (unpolished side) of the substrate. FIG. 5 shows the classic temperature dependence of the magnetization using an applied field of 500 Oe. The Curie temperature of the film, 395° K, agrees well with the characteristic Curie temperature value for spin polarized $CrO_2$.

Figure 6:
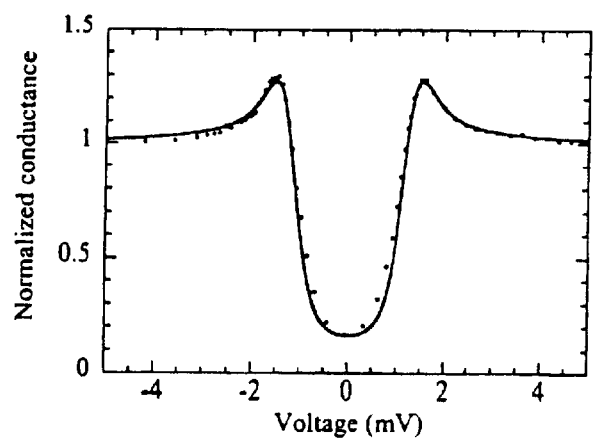
FIG. 6. is a graph of normalized conductance as a function of bias voltage for a $CrO_2$ thin film: solid circles indicate experimental data and a solid line indicates a modified BTK.

FIG. 6. is a graph of normalized conductance as a function of bias voltage for a $CrO_2$ thin film. The spin polarization of $CrO_2$ was measured by the point contact Andreev reflection (PCAR) method, which is described in detail in the articles by R. J. Soulen, Jr. et al., Science 282, 85 (1998), and S. K. Upadhyay et al., Phys. Rev. Lett. 81, 3247 (1998). At least 10 different junctions, established by gently pressing a superconducting (Pb) tip into the $CrO_2$ film, with contact resistance between 1 and 100 $\Omega$ were measured for each sample. Several different samples were studied. All samples were highly spin polarized. FIG. 6 shows typical conductance data for a $CrO_2$ film as a function of bias voltage, V, normalized at V>>$\Delta$(T)/e, where $\Delta$(T) is the superconducting gap at temperature, T, and e is the electron charge. Experimental curves for each junction were fitted separately by the modified BTK theory with only two fitting parameters, spin polarization, P, and barrier strength, Z, which is described in articles by R. J. Soulen et al., Science 282, 85 (1998) and G. E. Blonder et al., Phys. Rev. B 25, 4515 (1982). The spin polarization for each sample was obtained by averaging over the resulting values of P. The spin polarization for a $CrO_2$ thin film was found to be 81±3%, which is comparable to the values obtained for the $CrO_2$ films fabricated by other methods. The barrier strength Z range was 0.6–1.3.

In summary, an efficient and controllable method for depositing a high quality epitaxial $CrO_2$ thin film was developed using a standard CVD method with $CrO_2Cl_2$ as a precursor. The films were metallic, smooth, epitaxial, and highly spin polarized. This method enhances the possibilities of fabricating GMR and/or tunnel junction devices based on $CrO_2$, and thus opens up new opportunities in magnetoelectronics.

It will be understood, however, that modification and variations are possible within the scope of the appended claims. For example, the method may utilize other chromium precursors such as chromyl nitrate.

What is claimed is:

1. A method for forming a single-phase chromium dioxide layer on a $TiO_2$ substrate by chemical vapor deposition, the method comprising the steps of:

a. selecting a volatile liquid chromium oxide precursor that decomposes in a heated process chamber to provide a chromium dioxide layer on a $TiO_2$ substrate;

b. placing said volatile liquid chromium oxide precursor in a first bubbler;

c. transporting a chromium oxide precursor vapor with a carrier gas from said first bubbler into a heated process chamber having a $TiO_2$ substrate therein; and d. growing a single-phase chromium dioxide layer at a controlled growth rate on said $TiO_2$ substrate in said heated process chamber.

2. The method according to claim 1,
   wherein said volatile liquid chromium oxide precursor is chromyl chloride.

3. The method according to claim 1,
wherein said chromium dioxide layer and said $TiO_2$ substrate have the same crystallographic orientation.

4. The method according to claim 1,
wherein said first bubbler is cooled to a temperature of about 0° C.

5. The method according to claim 1,
wherein said carrier gas is selected from the group consisting of oxygen and argon.

6. The method according to claim 1,
wherein said process chamber is heated to a temperature of about 400° C.

7. The method according to claim 1,
wherein said growth rate is about 33 Å $min^{-1}$.

8. The method according to claim 1, further comprising the steps of:
   e. purging said heated process chamber of said chromium oxide precursor vapor;
   f. transporting a second precursor vapor that is a precursor to a non-magnetic layer with a carrier gas from a second bubbler into said heated process chamber having said chromium dioxide layered substrate therein; and
   g. growing a second layer on said chromium dioxide layered substrate at a controlled growth rate in said heated process chamber.

9. The method according to claim 8,
wherein said second layer is $TiO_2$.

10. The method according to claim 8, further comprising the steps of:
   h. purging said heated process chamber of said second precursor vapor;
   i. transporting a third precursor vapor with a carrier gas from at least one of said first bubbler or a third bubbler into said heated process chamber having said layered substrate therein; and
   j. growing a third layer on said layered substrate at a controlled growth rate in said heated process chamber.

11. The method according to claim 10, wherein said third precursor is said volatile liquid chromium oxide precursor.

12. A method for forming three layers of film on a $TiO_2$ substrate by chemical vapor deposition, the method comprising the steps of:
   a. selecting a volatile liquid chromium oxide precursor that decomposes in a heated process chamber to provide a single-phase chromium dioxide layer on a $TiO_2$ substrate;
   b. placing said volatile liquid chromium oxide precursor in a first bubbler;
   c. transporting a volatile liquid chromium oxide precursor vapor with a carrier gas from said first bubbler into a heated process chamber having a $TiO_2$ substrate therein;
   d. growing a single-phase layer of chromium dioxide at a controlled growth rate on said $TiO_2$ substrate in said heated process chamber;
   e. purging said heated process chamber of said volatile liquid chromium oxide precursor vapor;
   f. transporting a second precursor vapor with a carrier gas from a second bubbler into said heated process chamber having said chromium dioxide layered substrate therein; and
   g. growing a second layer at a controlled growth rate on said chromium dioxide layer of said $TiO_2$ substrate in said heated process chamber;
   h. purging said heated process chamber of said second precursor vapor;
   i. transporting a third precursor vapor with a carrier gas from at least one of said first bubbler or a third bubbler into said heated process chamber having said layered substrate therein; and
   j. growing a third layer at a controlled growth rate on said second layer of said layered substrate in said heated process chamber.

13. The method according to claim 12,
wherein said volatile liquid chromium oxide precursor is chromyl chloride.

14. The method according to claim 12,
wherein said volatile liquid precursor is chromyl chloride;
wherein said second layer is $TiO_2$;
wherein said third layer is $CrO_2$; and
wherein said growth rate of said first chromium dioxide layer is about 33 Å $min^{-1}$.

15. The method according to claim 12,
wherein said first and third bubblers are cooled to a temperature of about 0° C.; and wherein said heated process chamber is heated to a temperature of about 400° C.

16. A method for forming a single-phase chromium dioxide layer on a $TiO_2$ substrate by chemical vapor deposition, the method comprising the steps of:
   a. selecting a volatile liquid chromium oxide precursor that decomposes in a heated process chamber to provide a single-phase chromium dioxide layer on a $TiO_2$ substrate;
   b. placing said volatile liquid chromium oxide precursor in a bubbler;
   c. cooling said bubbler to a temperature of about 0° C.;
   d. transporting a volatile liquid chromium oxide precursor vapor with a carrier gas at a flow rate from about 20 to about 40 sccm from said bubbler into a heated process chamber having said $TiO_2$ substrate therein;
   e. growing a single-phase layer of chromium dioxide on said $TiO_2$ substrate in said heated process chamber at a controlled growth rate of about 33 Å $min^{-1}$;
wherein said volatile liquid precursor is chromyl chloride;
wherein said process chamber is heated to temperature of about 400° C.; and
wherein said $TiO_2$ substrate has the same crystallographic orientation as said chromium dioxide layer.

* * * * *